US007687328B2

(12) United States Patent
Park et al.

(10) Patent No.: US 7,687,328 B2
(45) Date of Patent: Mar. 30, 2010

(54) METHOD OF MAKING A POLYCRYSTALLINE THIN FILM, A MASK PATTERN USED IN THE SAME AND A METHOD OF MAKING A FLAT PANEL DISPLAY DEVICE USING THE SAME

(75) Inventors: Hye-Hyang Park, Suwon-si (KR); Ki-Yong Lee, Suwon-si (KR)

(73) Assignee: Samsung Mobile Display Co., Ltd., Yongin, Gyunggi-do (KR)

(*) Notice: Subject to any disclaimer, the term of this patent is extended or adjusted under 35 U.S.C. 154(b) by 830 days.

(21) Appl. No.: 11/485,947

(22) Filed: Jul. 12, 2006

(65) Prior Publication Data
US 2007/0015320 A1  Jan. 18, 2007

(30) Foreign Application Priority Data
Jul. 12, 2005 (KR) .................. 10-2005-0062845

(51) Int. Cl.
*H01L 21/00* (2006.01)
(52) U.S. Cl. .................. 438/149; 438/166; 438/401; 438/479; 438/488; 438/662; 438/689; 438/795; 257/E21.134
(58) Field of Classification Search .................. 438/799
See application file for complete search history.

(56) References Cited
U.S. PATENT DOCUMENTS
6,322,625 B2  11/2001  Inn

2002/0179001 A1* 12/2002 Jung .................. 117/4

FOREIGN PATENT DOCUMENTS
| CN | 1619775 | 5/2005 |
| CN | 1617300 | 5/2008 |
| JP | 2003-509844 | 3/2003 |

(Continued)

OTHER PUBLICATIONS

Notice of Allowability for KR 10-2004-0089918 issued on Oct. 25, 2007.

(Continued)

*Primary Examiner*—N Drew Richards
*Assistant Examiner*—Kyoung Lee
(74) *Attorney, Agent, or Firm*—Knobbe Martens Olson & Bear LLP

(57) ABSTRACT

A method of forming a polycrystalline thin film for a thin film transistor, a mask used in the method, and a method of making a flat panel display device using the method of forming a polycrystalline thin film for a thin film transistor are disclosed. Certain embodiments are capable of providing a display device in which the polycrystalline thin film is uniformly crystallized such luminance non-uniformity is reduced. In the method of forming a polycrystalline thin film for a thin film transistor, amorphous material is crystallized using a laser and a mask having a mixed structure of one or more transmission region sets each comprising one or more transmission regions through which the laser beam is capable of passing and one or more non-transmission regions through which the laser beam is not capable of passing. The laser beam is directed onto overlapping regions of the material.

26 Claims, 13 Drawing Sheets

FOREIGN PATENT DOCUMENTS

| | | |
|---|---|---|
| JP | 2003-151907 | 5/2003 |
| JP | 2004-111423 | 4/2004 |
| JP | 2004-274037 | 9/2004 |
| JP | 2004-349415 | 12/2004 |
| JP | 2005-123573 | 5/2005 |
| JP | 2005-129895 | 5/2005 |
| KR | 10-2002-0086047 | 11/2002 |
| KR | 10-2002-0091896 | 12/2002 |
| KR | 10-2004-0014797 | 2/2004 |
| KR | 10-2004-0089918 | 10/2004 |

OTHER PUBLICATIONS

Office Action issued on May 9, 2008 from the Chinese Patent Office in Chinese Application No. 200610121417.9.

Japanese Office Action in corresponding Japanese Patent Application No. 2006-192018 dated Jun. 2, 2009.

Certificate of Patent for Invention in corresponding Chinese Application No. 20061012417.9 dated May 20, 2009.

* cited by examiner

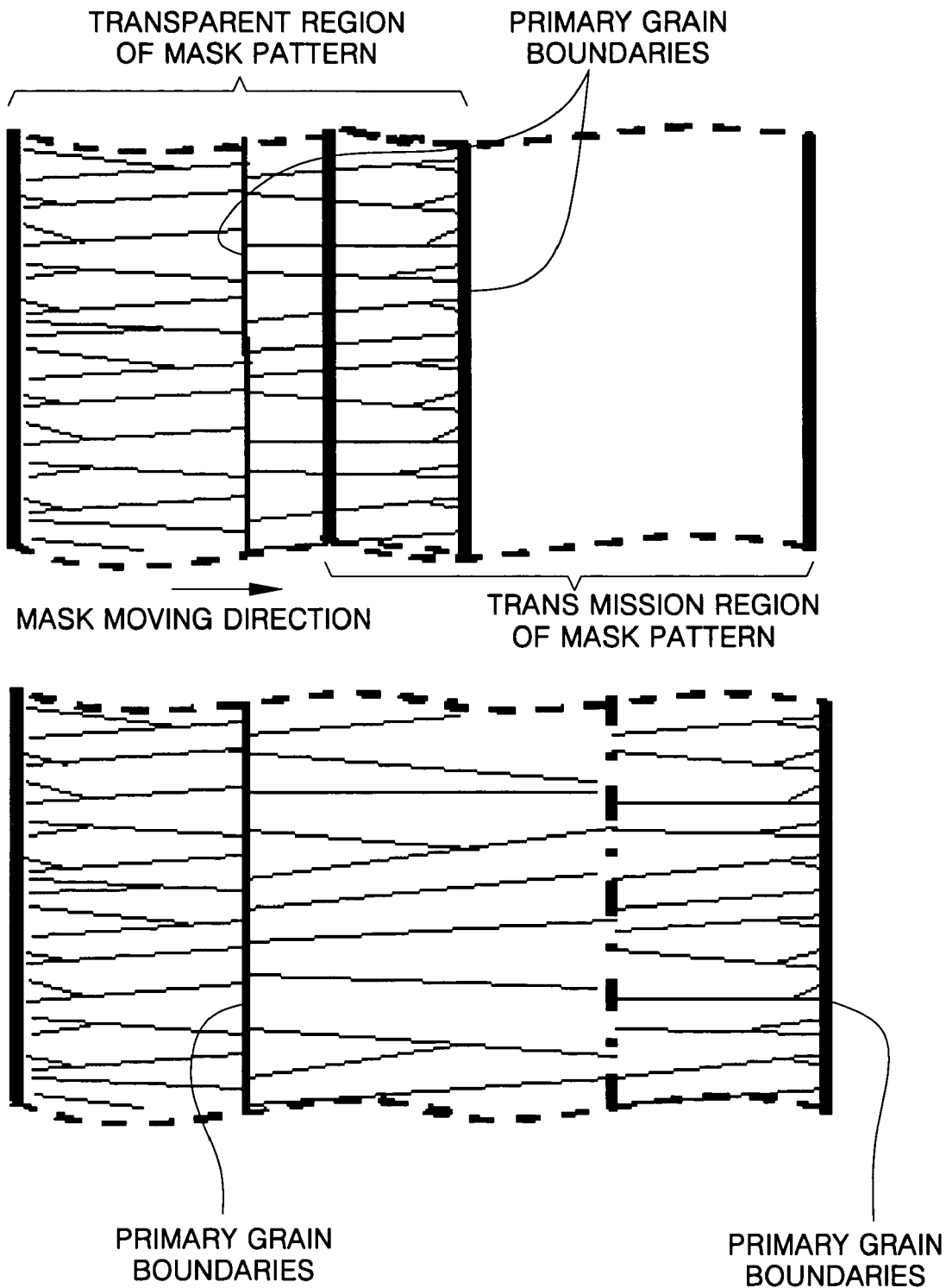

METHOD OF MAKING A POLYCRYSTALLINE THIN FILM, A MASK PATTERN USED IN THE SAME AND A METHOD OF MAKING A FLAT PANEL DISPLAY DEVICE USING THE SAME

CROSS-REFERENCE TO RELATED APPLICATION

This application claims the benefit of Korean Patent Application No. 10-2005-62845, filed on Jul. 12, 2005, the disclosure of which is hereby incorporated herein by reference in its entirety.

BACKGROUND OF THE INVENTION

1. Field of the Invention

The present invention relates to a method of making a polycrystalline silicon for a thin film transistor, a mask pattern used in the same and a method of making a flat panel display device by the same. More particularly, the invention relates to a method of making a polycrystalline silicon for a thin film transistor to reduce non-uniformity of luminance generated in a display device using a polycrystalline silicon fabricated according to sequential lateral solidification (SLS) crystallization technology, a mask pattern used in the method of making a polycrystalline silicon for a thin film transistor, and a method of making a flat panel display device by the method of making a polycrystalline silicon for thin film transistor.

2. Description of the Related Technology

Ordinarily, sequential lateral solidification (SLS) crystallization is a method for crystallizing grain silicon by directing a laser beam onto overlapping regions of an amorphous silicon layer two or more times so as to anneal the silicon, and thereby laterally grow silicon crystals, or grains. Polycrystalline silicon grains fabricated by the SLS crystallization method are each formed in a columnar shape having a long length in one direction, and grain boundaries are formed between adjacent grains.

It has been reported that polycrystalline or single crystal large silicon grains can be formed on a substrate by SLS crystallization technology, and characteristics similar to characteristics of a thin film transistor (TFT) fabricated of single crystal silicon are obtained when fabricating a TFT using the polycrystalline or single crystal large silicon grains.

FIG. 1A, FIG. 1B and FIG. 1C are drawings showing an ordinary SLS crystallizing method.

The SLS crystallizing method uses an annealing process, wherein amorphous silicon is melted in the laser beam transmission region when the laser beam is directed onto an amorphous silicon thin film layer through a mask having a laser beam transmission region and a laser beam non-transmission region as illustrated in FIG. 1A.

Crystallization starts at an interface between solid and molten silicon when cooling. A temperature gradient is formed in which the temperature gradually decreases in a direction from the interface to the molten silicon.

Therefore, referring to FIG. 1B, a polycrystalline silicon thin film layer is formed having grains of a long columnar shape oriented in a specific direction. Since the heat flows in a direction from the interface of the mask to the central part of a molten silicon layer, the polycrystalline silicon grains are laterally grown until the molten silicon layer is completely solidified. Thus, grains are grown from an amorphous silicon layer that is not melted such that grain boundaries are formed between adjacent grains. A grain boundary formed in a direction perpendicular to the direction of grain growth is a "primary grain boundary," as shown in FIG. 1B.

As illustrated in FIG. 1C, amorphous and crystalline silicon are melted by directing a laser beam onto the amorphous and polycrystalline silicon layer through a mask moved from one position to a next. The mask is moved through a predetermined sequence of positions and the laser beam is directed on to the silicon at each position. As shown in FIG. 1C, during this process, the mask is moved in such a way that a portion of the silicon to be melted and crystallized in the mask's second position overlaps the silicon melted and crystallized in the mask's first position. This is done so that the silicon melted in the mask's second position will crystallize according to the crystal structure of the silicon crystallized in the mask's first position. That is, the silicon crystallized in the mask's first position becomes a seed for the silicon melted in the mask's second position. This method has the advantageous effect of creating grains of increased length. Thus, the size of grains in a SLS crystallization method is based on the size of laser transmission regions on the mask and the number of repeated laser treatments.

FIG. 2 is a drawing schematically illustrating a mask pattern used in a method of making a polycrystalline silicon thin film by a conventional two shot type SLS crystallization technology. FIG. 3 is a drawing illustrating energy density in a laser beam used when fabricating polycrystalline silicon using the mask pattern of FIG. 2. Also shown is polycrystalline silicon fabricated according to the energy density.

Because the energy density in a laser beam may not be uniform, the energy density of a central part may be higher than that of the edge as illustrated in FIG. 3. As a result crystallinity of the crystallized polycrystalline silicon varies and the characteristics of TFT vary accordingly.

Therefore, non-uniformity of luminance is generated on a display if the energy density of the laser is not uniform when crystallizing amorphous silicon by an SLS crystallization technology.

FIG. 4A is a plan figure showing a mask used in a conventional laser shot mixing method of crystallizing silicon. As shown, on the right half, the mask has a first area comprising a single transmission region, and on the left half the mask has a second area comprising two transmission regions. The laser shot mixing method is used to crystallize a non-crystallized region by crystallizing a first portion of the region when the mask is in a first position. The mask is then moved to a second position such that the left half of the mask then occupies the space previously occupied by the right half of the mask. A second portion of the region is then crystallized with the mask in the second position. Accordingly, the second portion of the region overlaps the first portion of the region in a direction normal to the direction of mask movement. FIG. 4B and FIG. 4C are plan figures showing the mask and the silicon at progressive stages. FIG. 4B shows the mask and the silicon after the silicon has been crystallized with the mask at the first position and after the mask has been moved to the second position. Note that the silicon has been crystallized in locations corresponding to the transmission regions of the mask when the mask was in the first position. Note also the overlap of the transmission regions when the mask is in the second position with the silicon crystallized when the mask was in the first position. FIG. 4C shows the silicon after a first crystallization when the mask was in the first position and after a second crystallization when the mask was in a second position. Note that the center region of the silicon, which was exposed to the laser through transmission regions in the mask while the mask was in both the first and the second positions, is completely crystallized. That is, from top to bottom there are no gaps in the crystallized region. As the process continues, each successive regions receives two crystallizing laser exposures, and is completely crystallized. Also note, however, that the areas between regions are not exposed to laser treatment, and therefore are not crystallized.

FIG. 5 is a photograph showing stripe marks formed in the polycrystalline silicon fabricated by the SLS crystallization method with the conventional laser shot mixing technology described above with reference to FIG. 4A, FIG. 4B and FIG. 4C. The visual difference seen is an indication that the crystallization process is not entirely uniform. Such non-uniformity results in non-uniform transistor conductance properties and non-uniform luminance, and is, therefore, undesirable.

In addition, the laser shot mixing process suffers from a disadvantage that process time is increased because four shot processes are used to form at least one crystal. The mask of FIG. 4A has another disadvantage related to processing time. The mask of FIG. 4A is configured such that crystals grow substantially perpendicular to the direction of movement. Therefore to generate crystals with grain boundaries advantageously oriented, the mask is moved in a horizontal direction across the display with the display oriented as when viewed. Because the horizontal direction is longer than the vertical direction in the display, the movement is in the longer direction, and therefore an excessive number of mask movements are necessary.

In PCT international patent No. WO 97/45827 and U.S. Pat. No. 6,322,625, technologies for converting amorphous silicon into polycrystalline silicon and crystallizing only a selected region of the amorphous silicon with a SLS crystallization method after depositing amorphous silicon on a substrate are disclosed.

Furthermore, a crystallization method resulting in improved TFT characteristics is disclosed in U.S. Pat. No. 6,177,301. According to U.S. Pat. No. 6,177,301, the barrier effect grain boundaries have on charge carriers is minimized when the channel direction is parallel to the direction of grains grown by the SLS crystallizing method when fabricating a TFT for an LCD device including drivers and pixels. Conversely, when the grain boundaries are perpendicular to the direction of the channel, the grain boundaries act as traps and result in a TFT of inferior characteristics.

In circuits which include transistors which are perpendicular to one another, the crystal growth can be induced in a direction oriented ideally about 45 degrees with respect to the orientation of all transistors. This results in the grain boundary effects being generally matching among the transistors, and avoidance of much of the trap effect caused by grain boundaries being perpendicular to the channels. In some applications this advantageous effect may be achieved with angles of orientation from about 30 degrees to about 60 degrees. However, like the laser shot mixing technology described above with reference to FIG. 4A, FIG. 4B and FIG. 4C, the method of U.S. Pat. No. 6,177,301 also suffers from non-uniformity of the polycrystalline silicon grains according to non-uniformity of laser energy density. This results in similar non-uniformity of luminance in the display. Another disadvantage common to the method described above with reference to FIG. 4A, FIG. 4B and FIG. 4C, and the method of U.S. Pat. No. 6,177,301 is the uncrystallized areas between the crystallized regions, as shown in FIG. 4C.

A method for complete crystallization is described in Korean Patent Laid-open Publication No. 2002-93194 in which laser beam patterns are formed in a triangle shape ("◁"), and crystallization proceeds while moving the triangle shaped ("◁") laser beam patterns widthwise.

SUMMARY OF CERTAIN INVENTIVE ASPECTS

Therefore, in order to solve the foregoing problems of the prior art, certain aspects of the present invention at least provide a method of making a polycrystalline silicon thin film for a thin film transistor which improves non-uniformity of luminance due to a non-uniformity of the energy density in a laser beam when fabricating a polycrystalline silicon thin film with an SLS crystallizing method, and a mask used in the method.

One embodiment is a method of forming a polycrystalline silicon thin film including crystallizing a first area of amorphous silicon by applying a laser to the first area through a mask having a mixed structure of transmission region sets each including one or more transmission regions through which the laser is capable of passing and one or more non-transmission regions through which the laser is not capable of passing, where the first area aligns with a first transmission region of a first transmission region set. The method also includes moving the mask such that a second transmission region of a second transmission set aligns with a second area of silicon, where the second area overlaps the first area in the direction of mask movement by as much as 1/n of a transmission region in the direction of mask movement where n is a natural number and is the number of effective transmission region sets on the mask.

Another embodiment is a mask including a mixed structure of transmission region sets each having a plurality of transmission regions through which a laser can pass and a non-transmission region through which the laser is not capable of passing, where a distance x between the center of the lowermost transmission region of a first set and the center of an uppermost transmission region of a next adjacent set satisfies expression 1, expression 2, expression 3

$$x=(a+b)+((a+b)/m) \quad \text{[Expression 1]}$$

$$x=(a+b)-((a+b)/m) \text{ in case that } (a+b)/m<b \quad \text{[Expression 2]}$$

$$x=(a+b)+(a-I) \text{ and } a/2<I<a, \quad \text{[Expression 3]}$$

where a is the transmission region opening size in the direction of mask movement, b is the transmission region spacing in the direction of mask movement, m is a natural number of 2 or more as the number of effective transmission region sets on the mask, and I is the width in the direction of mask movement by which the silicon corresponding to the transmission regions of a first transmission region set while the mask is at a first position are overlapped by the positions of the transmission regions of an adjacent transmission region set after the mask has been moved.

Another embodiment is a method of making a polycrystalline silicon thin film. The method includes crystallizing amorphous silicon with a laser while using a mask having a mixed structure of plural non-transmission region sets each including one or more non-transmission regions through which the laser is not capable of passing and one or more transmission regions through which the laser is capable of passing, where silicon areas aligned with the non-transmission regions are overlapped by as much as 1/n of a non-transmission region after moving the mask, and where n is a natural number as the number of effective non-transmission region sets.

Another embodiment is a mask including a mixed structure of non-transmission region sets each including one or more non-transmission regions through which the laser is not capable of passing and one or more transmission regions through which the laser is capable of passing, where non-transmission regions of a first non-transmission region set align with transmission regions of a next adjacent non-transmission region set.

BRIEF DESCRIPTION OF THE DRAWINGS

The above and other features and advantages of certain embodiments will become more apparent through the following detailed description of certain embodiments with reference to the attached drawings in which:

FIGS. 1A to 1C are drawings schematically illustrating an ordinary SLS crystallizing method;

DETAILED DESCRIPTION OF CERTAIN INVENTIVE EMBODIMENTS

Figure 1A:
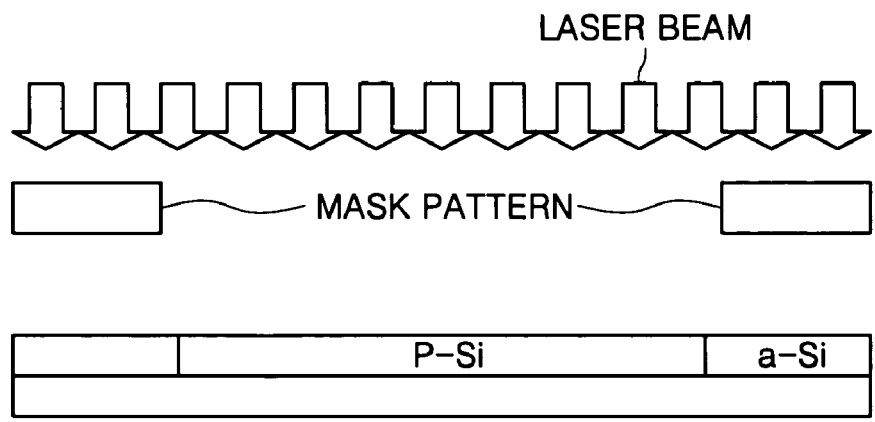
Figure 1B:
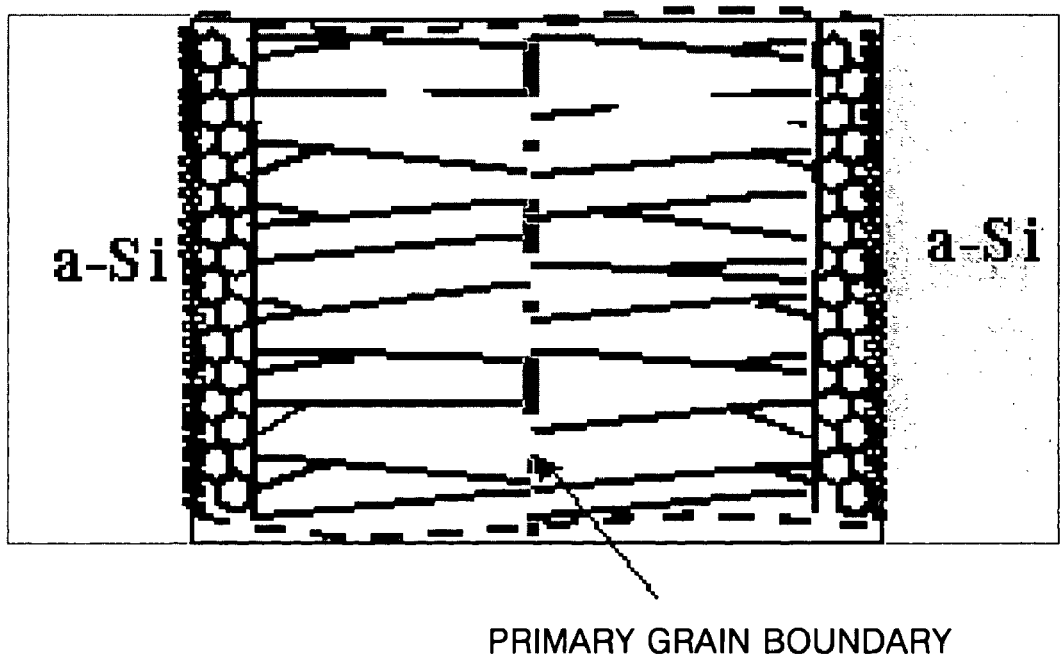
Figure 2:
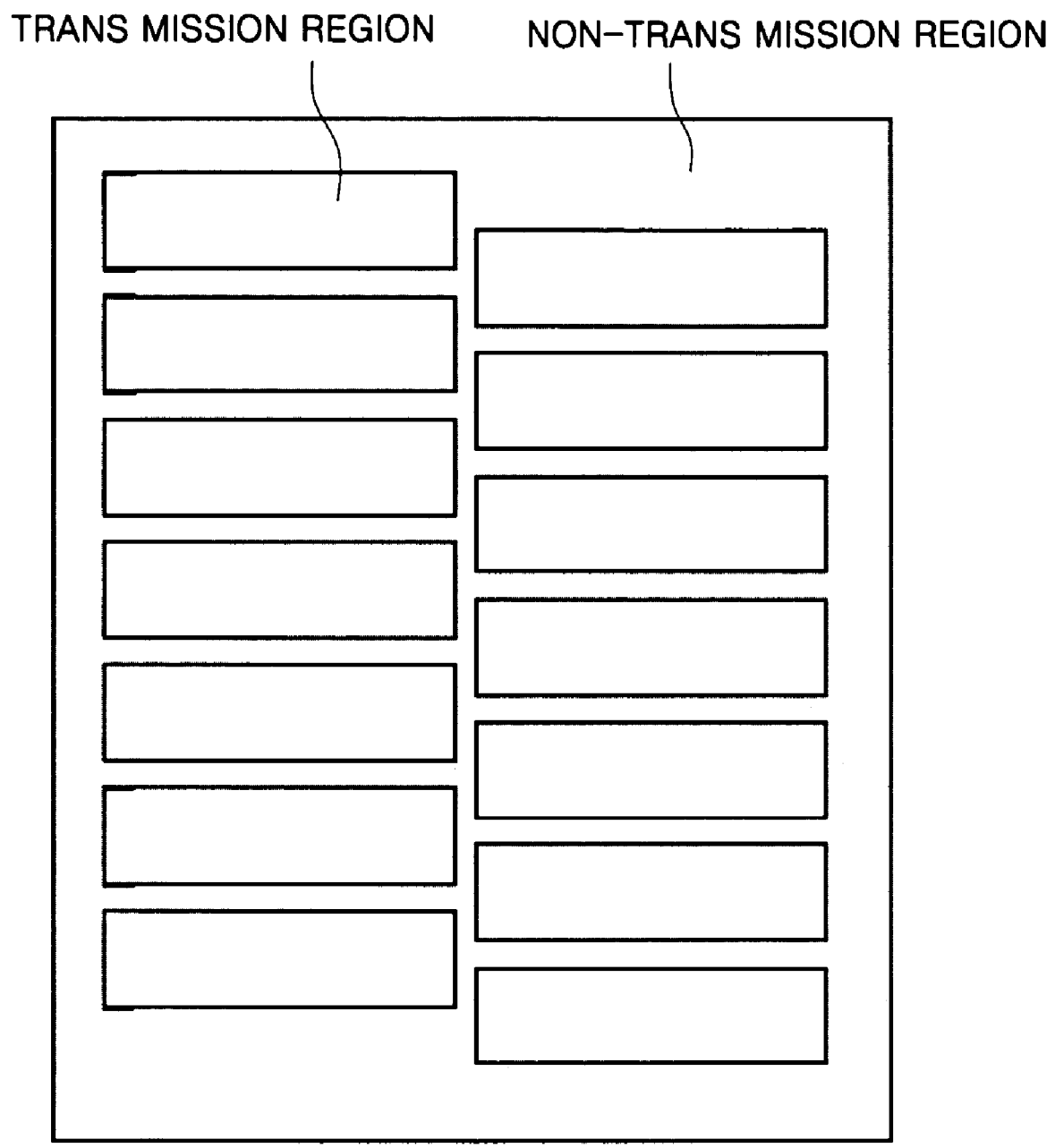
FIG. 2 is a drawing illustrating a mask pattern used in a method of making a polycrystalline silicon thin film by a conventional two shot type SLS technology.
Figure 3:
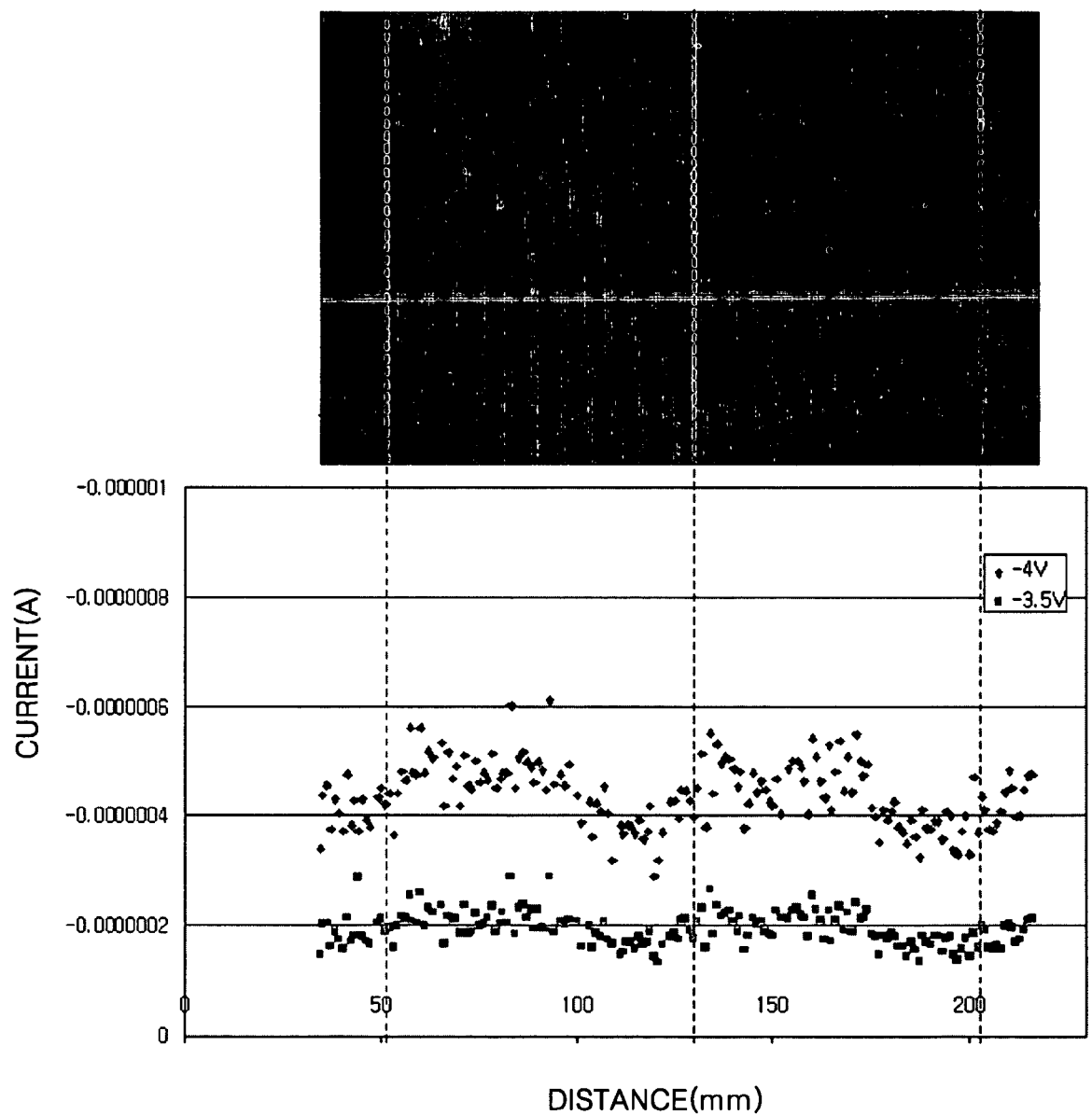
FIG. 3 is a drawing schematically illustrating non-uniformity in the crystal structure generated using the conventional SLS technology.
Figure 4A:
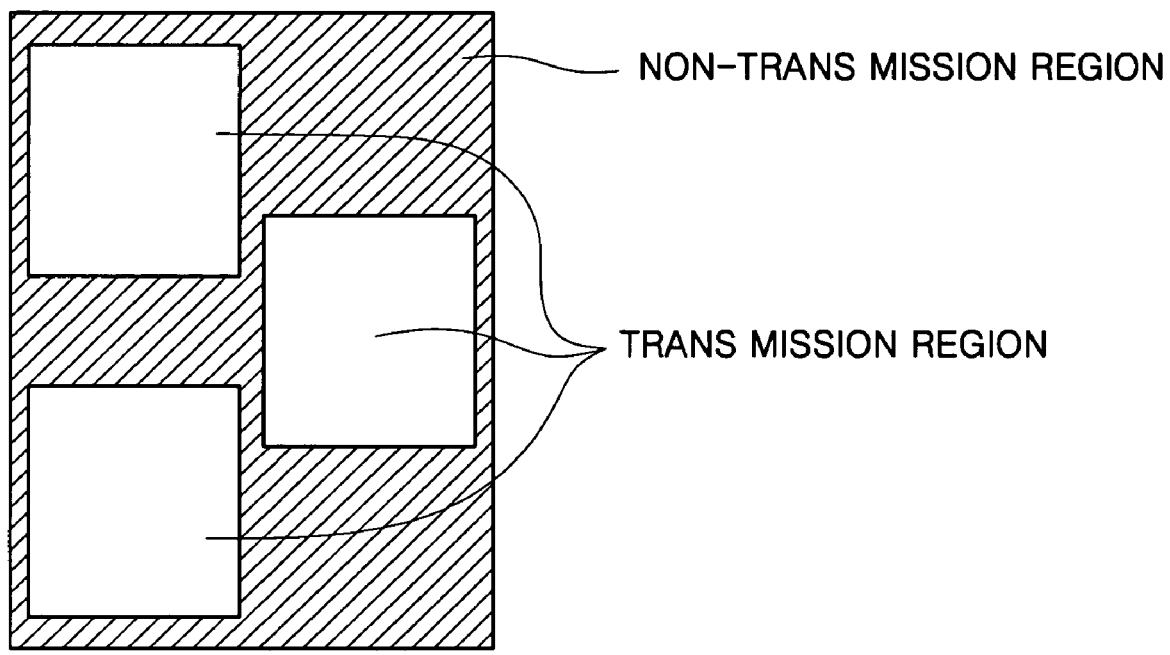
FIGS. 4A to 4C are plan figures schematically illustrating a method for crystallizing amorphous silicon using structures of a mask pattern used in a method of making a polycrystalline silicon thin film according to laser shot mixing in an ordinary SLS crystallization technology.
Figure 4B:
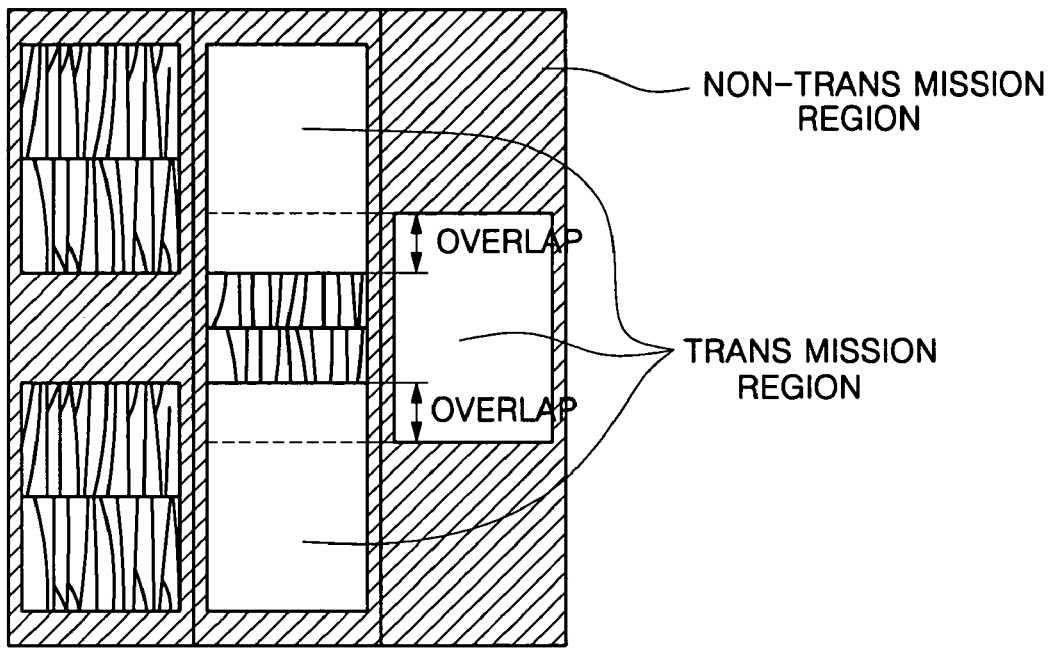
Figure 4C:
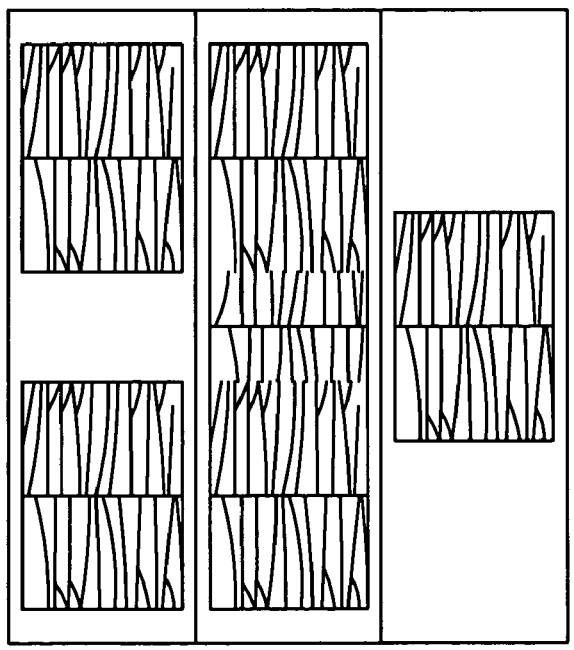

Certain embodiments will now be described in detail in connection with with reference to the accompanying drawings. For reference, like reference characters designate corresponding parts throughout several views.

Generally, the mobility of carriers within a TFT varies depending on the size and the orientation of the polycrystalline silicon grains. For example, the field mobility is increased by as much as 15% when the length of the grains is about 3.5 μm compared with when it is about 3 μm.

Since certain current characteristic values of the TFT are directly related to mobility, non-uniformity of luminance due to non-uniformity of energy in a laser beam can be improved by controlling the size of the polycrystalline silicon grains.

Figure 6:
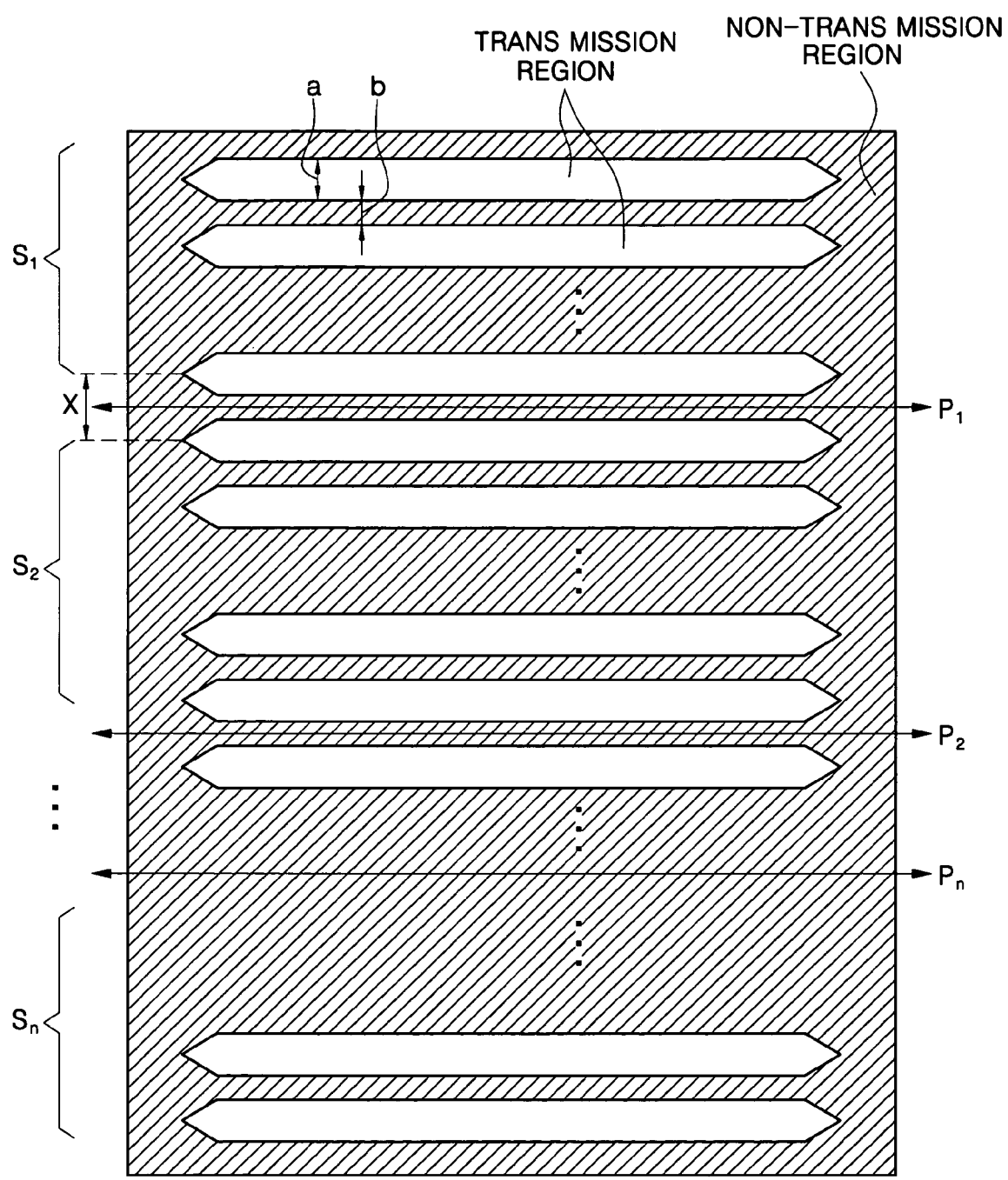
FIG. 6 is a drawing schematically illustrating a mask according to certain embodiments of the invention.

FIG. 6 is a drawing schematically illustrating a mask with a pattern according to one embodiment of the invention.

The mask of FIG. 6 is configured to be used in an annealing method of crystallizing silicon wherein a laser beam is directed toward the silicon and the mask selectively passes the laser radiation to predetermined regions. The silicon in the predetermined regions melts because of the laser beam and cools once the laser beam is removed. As the silicon cools, crystals grow. After the initial annealing, the mask is moved in a certain direction, and a next annealing is performed. This process is repeated until the silicon is crystallized according to the desired results. The mask of FIG. 6 has a pattern wherein transmission regions of equal size and shape have been formed within a larger non-transmission region. The non-transmission regions are configured to prevent laser light from reaching and melting the silicon. The transmission regions are configured to substantially transmit light of a laser so that the silicon exposed melts. The transmission regions are each formed to be elongated in a direction normal to the direction of mask movement and are arranged sequentially in the direction of mask movement. As shown in FIG. 6, the transmission regions have an opening size in the direction of mask movement, a, and a spacing in the direction of mask movement, b. Also shown are transmission region sets $S_1$, $S_2, \ldots S_n$ separated by boundaries P1, P2, ..., Pn, and arranged such that $S_1$ is in front of $S_2$ with respect to the direction of mask movement. The mask is configured to be moved such that the post-movement position of the boundary $P_1$ aligns with the pre-movement position of the top of the mask. The mask is configured such that the resultant crystal grain boundaries are parallel with the direction of mask movement. Therefore, the mask is configured to be moved in a vertical direction across the display with the display oriented as when viewed. Because the vertical direction is shorter than the vertical direction in the display, the movement is in the shorter direction, and therefore a minimum number of mask movements are necessary.

Figure 7:
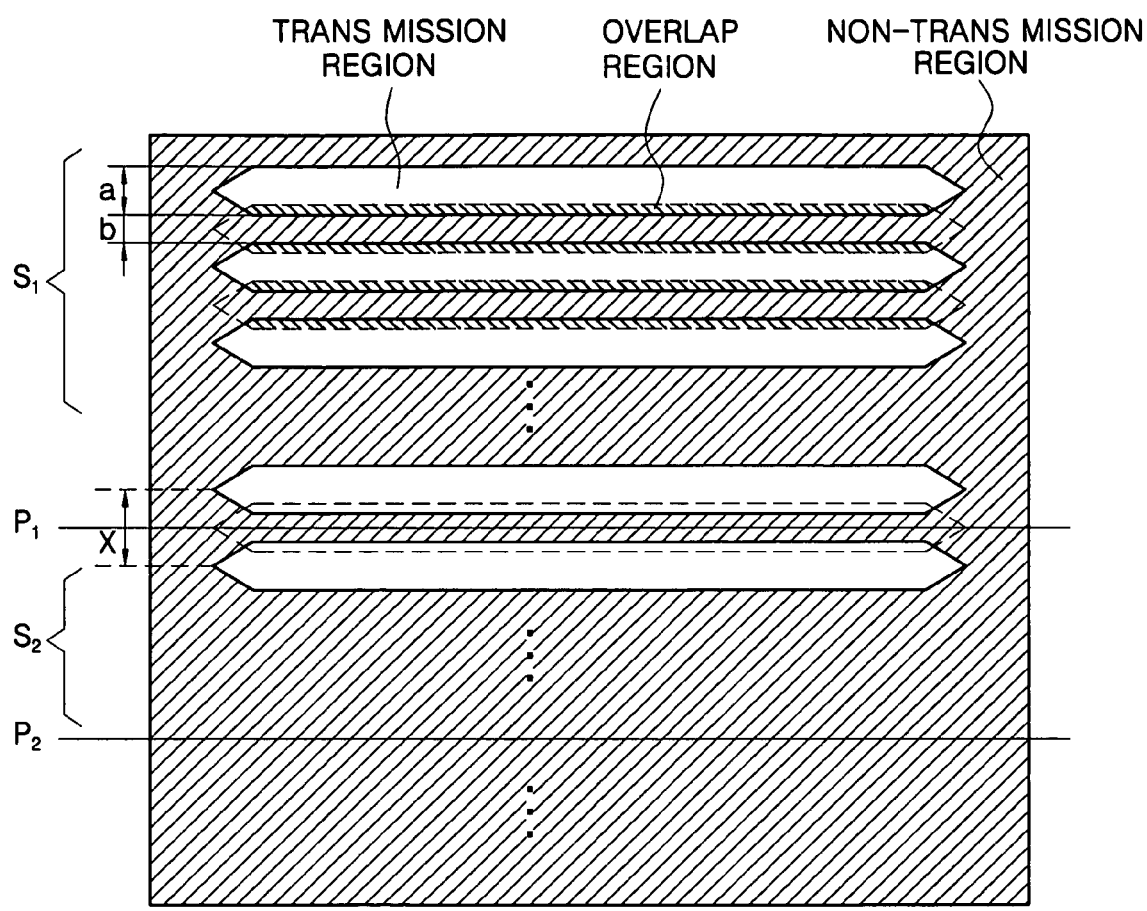
FIG. 7 is a drawing schematically illustrating a method for crystallizing amorphous silicon with two laser shots using the mask pattern of FIG. 6.

FIG. 7 is a drawing schematically illustrating a method for crystallizing amorphous silicon by two shots regardless of the number of scans in the SLS crystallization technology using the mask pattern of FIG. 6. FIG. 7 shows the mask in a first position with transmission regions (indicated with solid boundaries). Note that the ellipsis ( ... ) indicate that the transmission regions fill the areas of each transmission region set. The dashed lines indicate the post-shift position of the transmission regions of the second set $S_2$ relative to the pre-shift positions of the transmission regions of the first set $S_1$. As shown, the positions of the transmission regions of the second transmission region set $S_2$ after the shift are offset from and overlap the positions of the first transmission region set $S_1$ prior to the shift. As discussed above, a laser beam is directed to the silicon with the mask in various positions, and the silicon exposed at each position is melted and crystallizes when solidifying. That is, when the mask is in the first position, a first portion of silicon, aligned with the transmission regions of the first set $S_1$ is crystallized. The mask is shifted to a second position such that the boundary $P_1$ aligns with the pre-movement position of the top of the mask. Then, with the mask is in the second position, a second portion of silicon, aligned with the transmission regions of the second set $S_2$ is crystallized. Because of the spatial relationship between the transmission regions of the first and second sets $S_1$, and $S_2$ substantially the entire area was exposed by either the first laser beam application or the second laser beam application or both. Accordingly, this is an explanation of a two-shot type of crystallization method. Other spatial relationships between the transmission regions of adjacent sets can be used advantageously in m-shot crystallization methods, where m is the number of effective transmission region sets and the number of laser beam exposures.

In the case of a m-shot type of crystallization method, the transmission region pattern of the mask, may be configured such that a distance x between the center of the lowermost transmission region of a first set $S_1$ and the center of an uppermost transmission region of a next adjacent set $S_2$ satisfies expression 1 or expression 2:

$$x=(a+b)+((a+b)/m), \quad \text{[Expression 1]}$$

$$x=(a+b)-((a+b)/m) \text{ in case that } (a+b)/m<b, \quad \text{[Expression 2]}$$

where a is the transmission region opening size in the direction of mask movement, b is the transmission region spacing in the direction of mask movement, m is a natural number of 2 or more as the number of effective transmission region sets on the mask, and the sum of the distance in the direction of mask movement of the non-transmission regions above the first and below the last transmission regions is equal to b.

If the mask pattern satisfies the above expressions, the whole region of amorphous silicon can be crystallized by directing a laser beam onto amorphous silicon the same number of times as there are effective transmission sets in the mask pattern. This can be as few as two.

In some embodiments, transmission regions are formed in a rectangular or polygonal shape, but they are not limited to the rectangular or polygonal shape. Other shapes such as irregular, circular, and oval may also be used.

Figure 8:
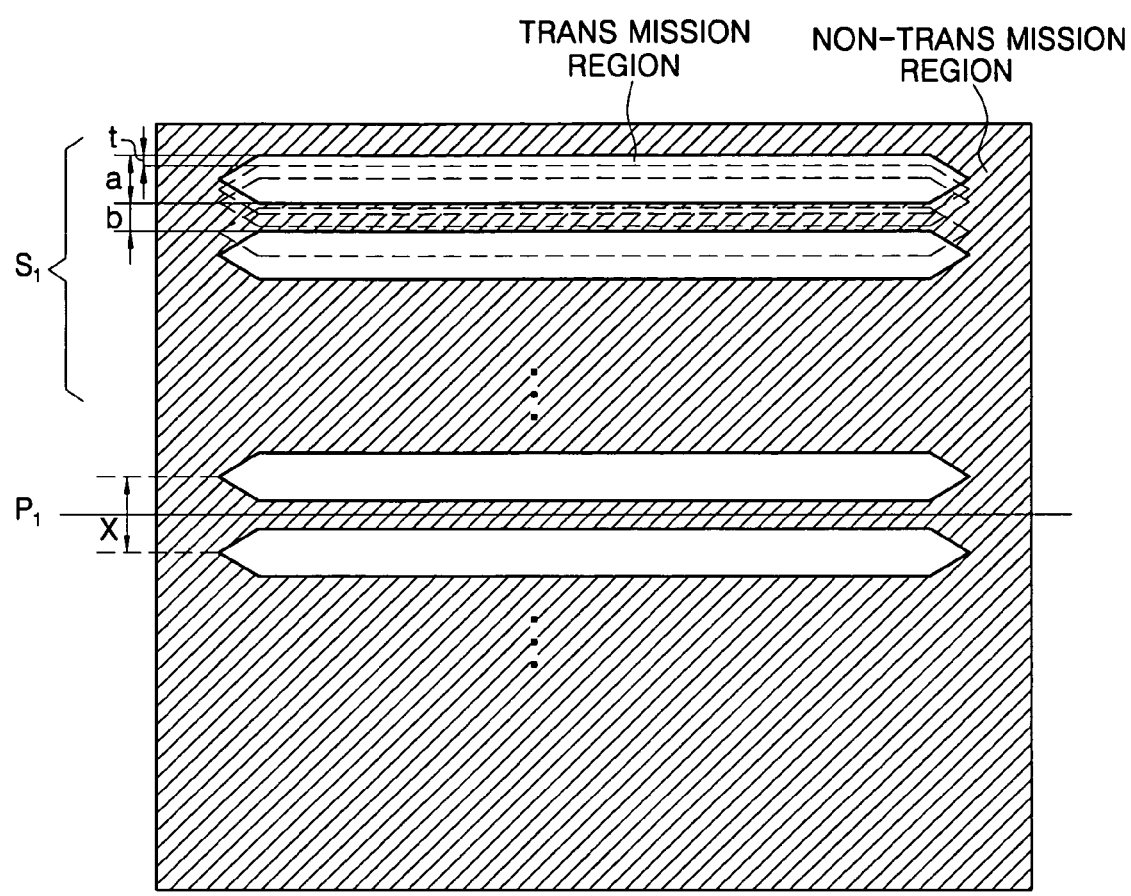
FIG. 8 is a drawing schematically illustrating a method for crystallizing amorphous silicon by SLS crystallization technology in which the size of the grains is determined according to the number of scans using the mask pattern of FIG. 6.

FIG. 8 is a drawing schematically illustrating another method for crystallizing amorphous silicon with SLS crystallization. In this embodiment, the mask of FIG. 6 is used and the size of the grains is controlled by the number of scans at each general mask position. That is, long parallel grains are formed at each general mask position as the silicon is exposed to the laser beam multiple times with the mask being slightly shifted for each exposure. For example, when the mask is in its first position the silicon receives a first exposure to the laser beam through the mask, and the exposed portion of silicon melts and crystallizes. The mask is shifted by t and the silicon receives a second exposure to the laser beam through the mask. The value of t is bounded such that t<a so that the second laser beam exposure exposes both a new portion of silicon and a portion of silicon exposed during the first exposure. This is done so that the silicon melted in the mask's second position will crystallize according to the crystal structure of the silicon crystallized in the mask's first position. That is, the silicon crystallized in the mask's first position becomes a seed for the silicon melted in the mask's second position. Accordingly the length of the grains is a+t. With repeated shifts the grain length is a+nt, where n is the number of laser beam exposures. In some embodiments t=a/n.

In accordance with some embodiments, the mask of FIG. 6 may be configured such that a distance x between the center of the lowermost transmission region of a first set $S_1$ and the center of an uppermost transmission region of a next adjacent set $S_2$ satisfies expression 3:

$$x=(a+b)+(a-I) \text{ and } a/2<I<a, \quad \text{[Expression 3]}$$

where a is the transmission region opening size in the direction of mask movement, b is the transmission region spacing in the direction of mask movement, the sum of the distance in the direction of mask movement of the non-transmission regions above the first and below the last transmission regions is equal to b, and I is the width in the direction of mask movement by which the silicon corresponding to the transmission regions of a first transmission region set while the mask is at a first position are overlapped by the positions of the transmission regions of an adjacent transmission region set after the mask is shifted such that the boundary $P_1$ is aligned with the position of the top of the mask prior to shifting. In some embodiments I=a−t. Furthermore, in some embodiments I satisfies the following expression 4:

$$I=a-[(\text{grain length}-a)/(\text{the number of scans}-2)], \quad \text{[Expression 4]}$$

wherein if I is a/2 or less, it becomes similar to a two shot process. That is, the whole amorphous silicon region is crystallized with the mask having been in two general positions.

Figure 5:
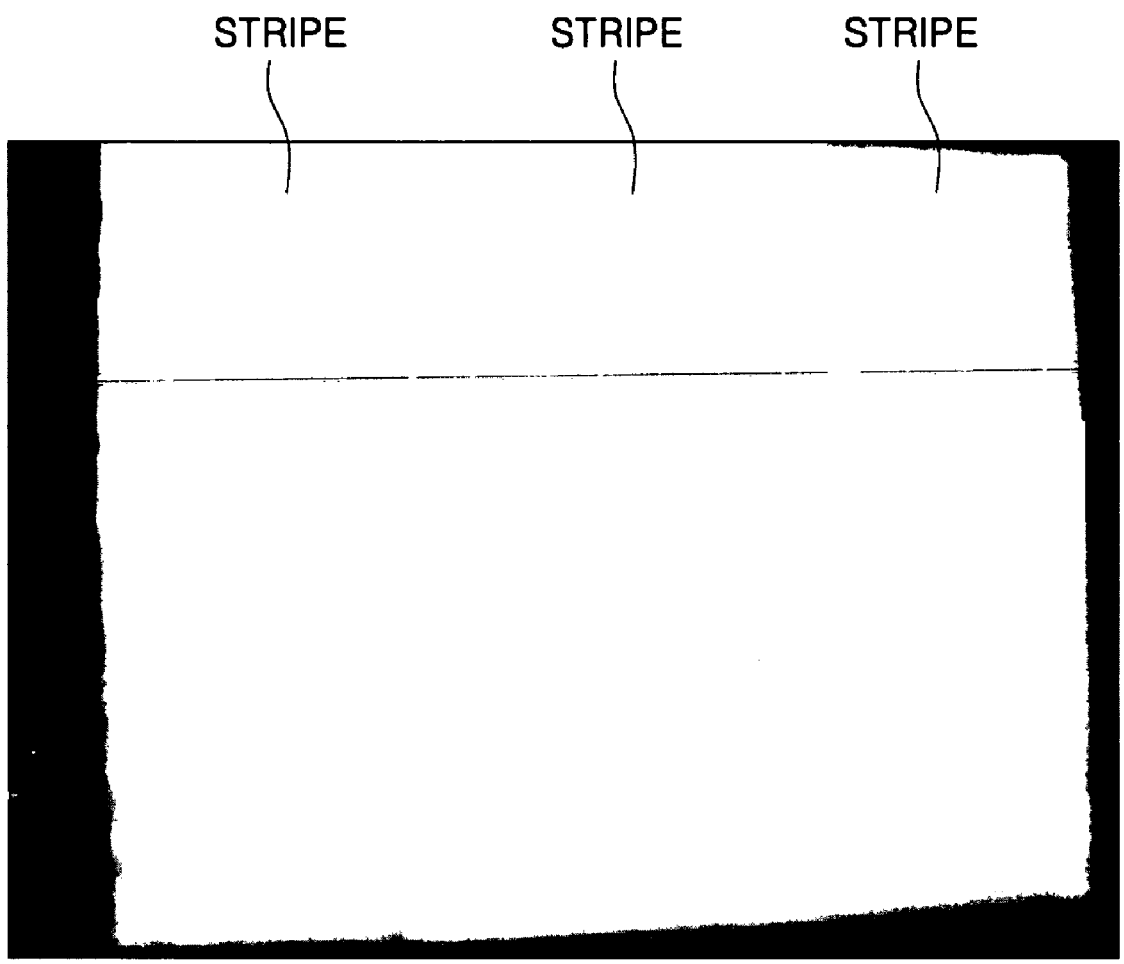
FIG. 5 is a photograph showing stripe marks formed with the method described with reference to FIGS. 4A to 4C.
Figure 9:
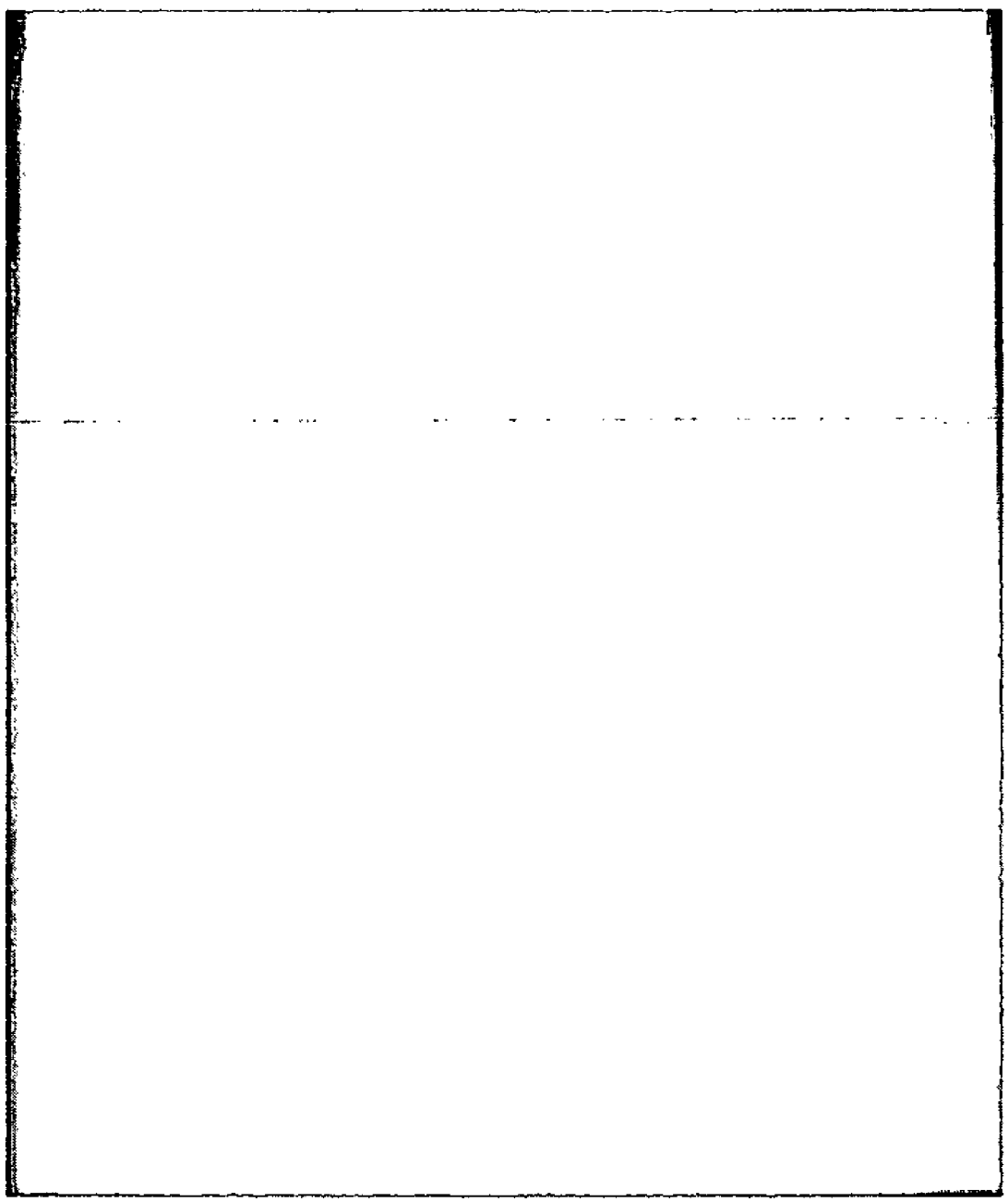
FIG. 9 is a photograph showing stripe marks formed with the method described with reference to FIG. 8.

FIG. 9 is a photograph showing stripe marks formed in the polycrystalline silicon fabricated by the SLS crystallization method described above with reference to FIG. 8. Comparison with the photograph of FIG. 5 reveals that the stripe marks are significantly reduced. The visual difference is an indication that the crystallization process described above with reference to FIG. 8 results in significantly more uniform crystallization than the prior art. Such improved uniformity results in more uniform transistor conductance properties and, therefore more uniform luminance.

Figure 10:
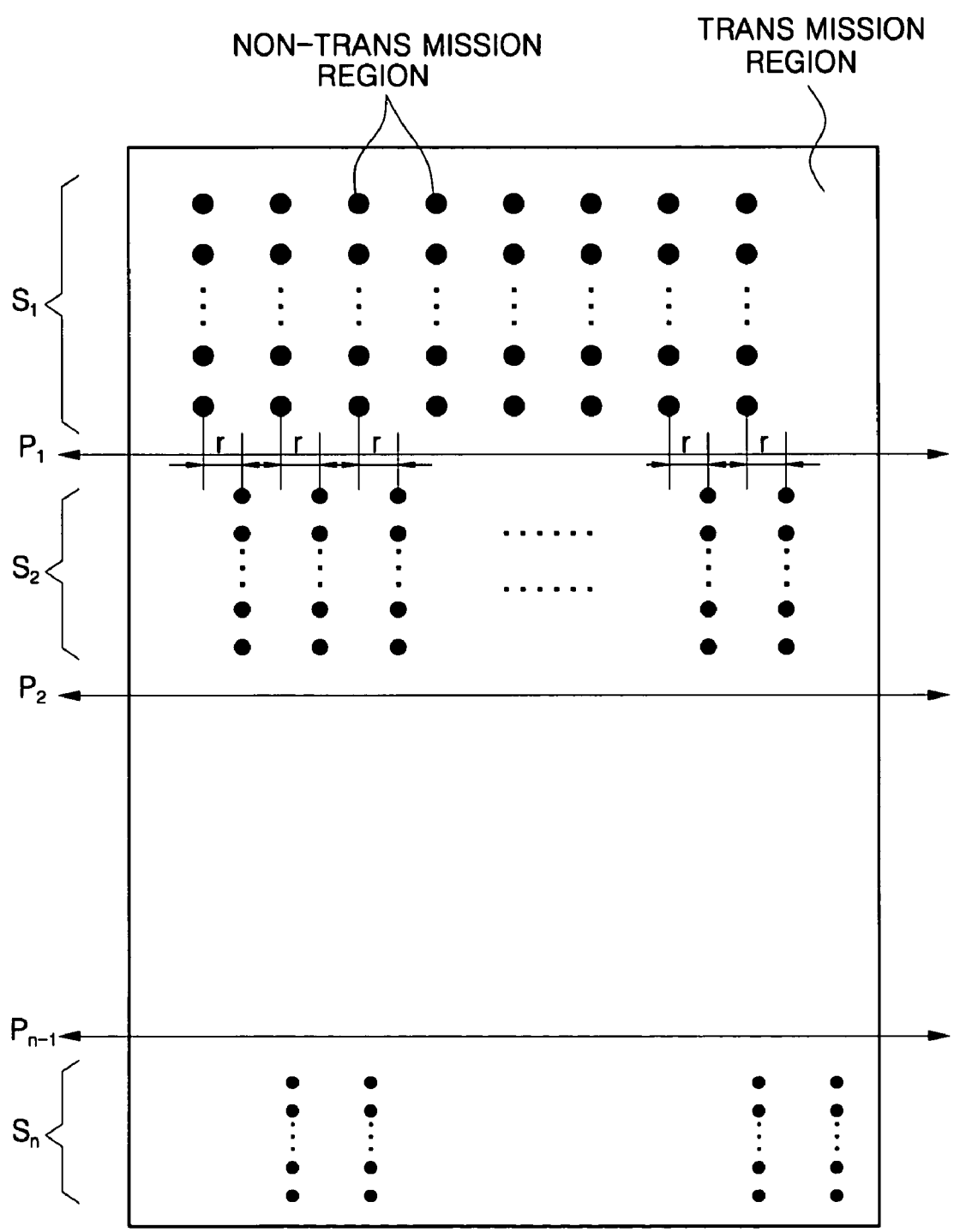
FIG. 10 is a drawing schematically illustrating a mask pattern according to another inventive embodiment.

FIG. 10 is a drawing schematically illustrating a mask according to another embodiment. Similar to other embodiments, this mask is configured to be used with a laser to induce crystallization of a thin film silicon layer by repeated exposure of the silicon to the laser beam through the mask, where the mask is shifted between exposures.

Referring to FIG. 10, non-transmission regions are formed in a dot pattern shape on the mask. The mask pattern comprises non-transmission region sets $S_1, S_2, \ldots S_n$, each comprising a plurality of non-transmission regions. Within each set the non-transmission regions are of the same size and shape and are arranged in an array of rows and columns. Various shapes and configurations may also be used. With a next adjacent set, however, the non-transmission regions are smaller and are offset from those of the previous adjacent set by a distance r perpendicular to the direction of mask movement.

As in other embodiments the silicon exposed to the laser beam through the transmission regions melts, subsequently cools, and crystallizes with a characteristic grain growth. The grain growth will be influence by the crystal orientation of the crystallized silicon at the boundary of the crystallized silicon and the molten silicon. That is, the crystallized silicon provides a seed for the molten silicon. As each silicon area is repeatedly exposed to the laser beam with the mask non-transmission region sets of diminishing non-transmission region size, the resulting crystal grain sizes become larger and more uniform. This occurs because each progressive non-transmission region set is offset, and as the seeds become smaller the likelihood that each seed comprises a single grain increases. The mask can be configured to provide any number of non-transmission sets, so as to approach grain sizes with dimensions corresponding to the array of non-transmission regions. In some embodiments, the number of non-transmission regions in each set may decrease. In some embodiments, similar to the embodiments discussed with reference to FIG. 8 multiple scans with small mask shifts may be used with the mask of FIG. 10.

Figure 11:
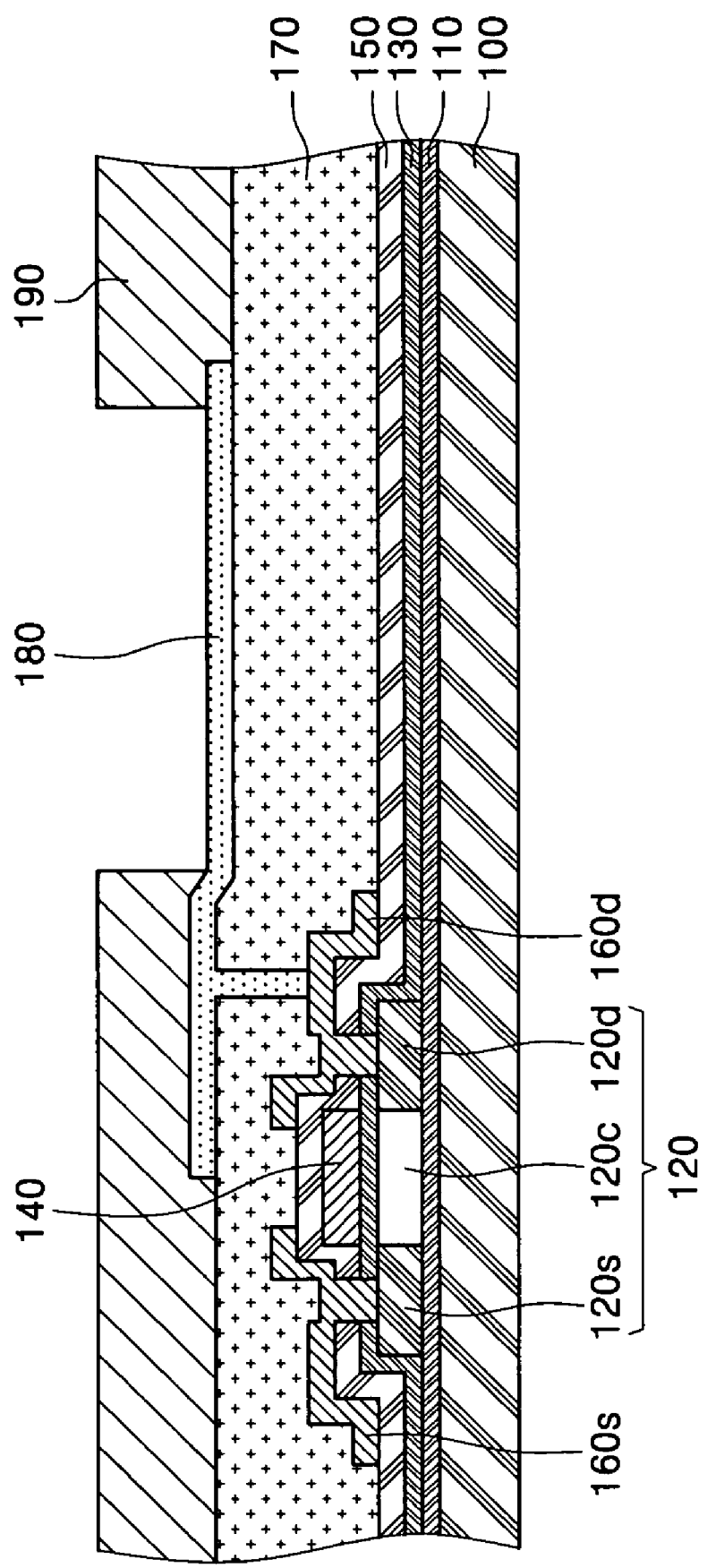
FIG. 11 is a cross sectional view illustrating a cross sectional structure of an organic electroluminescence display device in which polycrystalline silicon formed by a method for forming polycrystalline silicon from amorphous silicon.

FIG. 11 is a cross sectional view illustrating a cross sectional structure of an organic electroluminescence display device in which polycrystalline silicon has been formed by a method for forming polycrystalline silicon from amorphous silicon by any of the embodiments discussed herein or equivalents.

Referring to FIG. 11, a buffer layer 110 is formed on a substrate 100. An insulating transparent substrate or transparent metallic substrate can be used as the substrate 10.0 The buffer layer 110 can be used selectively, and may comprise at least one of $SiN_x$ and $SiO_2$.

A semiconductor layer 120 is formed by patterning the crystallized polycrystalline silicon layer after depositing amorphous silicon on the buffer layer 110 and crystallizing the amorphous silicon layer into a polycrystalline silicon layer 120 by any SLS crystallizing method discussed herein or equivalents.

A gate electrode 140 is formed by patterning the gate electrode material after forming a gate insulation film 130 over the entire substrate 100 using, for example at least one of $SiN_x$ and $SiO_2$ deposited on the gate insulation film 130. After forming the gate electrode, source/drain regions 120s and 120d are formed on the semiconductor layer 120 by doping p type impurities or n type impurities on the semiconductor layer 120 using the gate electrode 140 as a mask.

After forming an interlayer insulation film 150 over the substrate 100, contact holes for contacting source/drain electrodes 160s, 160d and source/drain regions 120s, 120d are formed in the gate insulation film 130 and the interlayer insulation film 150.

The gate insulation film 130, gate electrode 140 and interlayer insulation film 150 may be formed using materials conventionally known and used.

Although a top gate type thin film transistor in which the gate electrode 140 is formed on an upper part of the semiconductor layer 120 is described, polycrystalline silicon of the methods described herein may also applied to a bottom gate type thin film transistor in which the gate electrode 140 is formed on a lower part of the semiconductor layer 120.

An insulation film 170 is applied to the source/drain electrodes 160s and 160d. The insulation film 170 may be a protection film, a planarization film and/or a laminated film. After patterning and forming a pixel electrode 180 on the insulation film 170, a pixel define layer 190 is patterned and formed such that the pixel define layer may be formed over the substrate 100 so as to cover an edge portion of the pixel electrode, and an upper part of the pixel electrode 180 is exposed.

The organic electroluminescence display device may be completed by forming an organic light-emitting layer containing an organic film layer and an upper electrode on an upper part of the pixel electrode 180 in the same process as conventionally used, although this is not illustrated in FIG. 11.

Although the organic electroluminescence display device is discussed as an example of an application of the embodiments discussed herein, a polycrystalline silicon thin film fabricated according to these embodiments or their equivalents can be applied to all active type flat panel display devices, as well as other thin film active devices for applications other than displays. Additionally, these methods or equivalents may also be used to generate crystals of materials other than silicon, and such crystals may be grown on or in any number of substrate materials.

As used herein, the phrase "the direction of mask movement" has been used as a reference for certain orientations. When used, the phrase "the direction of mask movement" or other such similar phrases, means substantially the direction of mask movement if the mask were moved directly from one position of exposure to a next.

As described above, the present embodiments are capable of substantially preventing non-uniform crystallization of polycrystalline silicon resulting at least in part from a non-uniformly of laser beam energy during crystallization While the invention has been shown and described with reference to particular embodiments thereof, it will be understood by those skilled in the art that the foregoing and other changes in form and details may be made therein without departing from the spirit and scope of the invention.

What is claimed is:

1. A method of forming a polycrystalline thin film comprising:
   crystallizing a first area by applying a laser beam to the first area through a mask having a mixed structure of transmission region sets each comprising one or more transmission regions through which the laser beam is capable of passing and one or more regions which are opaque to the laser beam, wherein the first area aligns with a first transmission region of a first transmission region set; and
   moving the mask such that a second transmission region of a second transmission set aligns with a second area, wherein the second area overlaps the first area in the direction of mask movement, by about 1/n where n is the number of transmission region sets to be used.

2. The method according to claim 1, wherein the polycrystalline thin film is part of a flat panel display having first and second axis and the direction of mask movement is substantially in the direction of the longer of the first and second axis.

3. The method according to claim 1, further comprising crystallizing the second area by annealing the second area.

4. The method according to claim 1, further comprising moving the mask a distance t such that the first transmission region aligns with a third area, wherein the third area overlaps the first area in the direction of mask movement by a-t, wherein a is the transmission region opening size in the direction of mask movement, and t is less than a.

5. The method according to claim 1, wherein a distance x in the direction of mask movement between the center of the lowermost transmission region of the first set and the center of an uppermost transmission region of the second set satisfies expression 1 or expression 2:

$$x=(a+b)+((a+b)/m),\qquad\text{[Expression 1]}$$

$$x=(a+b)-((a+b)/m) \text{ where } (a+b)/m<b,\qquad\text{[Expression 2]}$$

wherein a is the transmission region opening size in the direction of mask movement, b is the transmission region spacing in the direction of mask movement, m is a natural number of 2 or more and is the number of effective transmission region sets on the mask.

6. The method according to claim 5, wherein each transmission region has a polygonal shape.

7. The method according to claim 5, wherein n is 2.

8. The method according to claim 1, wherein a distance x between the center of the lowermost transmission region of the first set and the center of an uppermost transmission region of the second set satisfies expression 3:

$$x=(a+b)+(a-I) \text{ and } a/2<I<a,\qquad\text{[Expression 3]}$$

where a is the transmission region opening size in the direction of mask movement, b is the transmission region spacing in the direction of mask movement, and I is the width in the direction of mask movement by which the area corresponding to the transmission regions of a first transmission region set while the mask is at a first position is overlapped by the positions of the transmission regions of an adjacent transmission region set after the mask has been moved.

9. The method according to claim 8, wherein I satisfies the following expression 4:

$$I=a-[(\text{grain length}-a)/(\text{the number of scans}-2)].\qquad\text{[Expression 4]}$$

10. A method of making a polycrystalline thin film, the method comprising crystallizing a plurality of areas with a laser beam using a mask having a mixed structure comprising a plurality of non-transmission region sets, each non-transmission region set comprising one or more non-transmission regions which are opaque to the laser beam, the mixed structure further comprising one or more transmission regions through which the laser beam is capable of passing, wherein areas aligned with the non-transmission regions are overlapped by about 1/n after moving the mask, where n is the number of transmission sets to be used.

11. The method according to claim 10, wherein a non-transmission region in a first non-transmission region set is spaced apart in a direction perpendicular to the direction of mask movement from a non-transmission region in a next adjacent non-transmission region set in the direction of mask movement.

12. The method according to claim 10, wherein the non-transmission regions have a dot shape.

13. A method of fabricating a flat panel display device, the method comprising:
forming a polycrystalline thin film according to the method of claim 1; and
forming a thin-film transistor on the polycrystalline thin film.

14. The method according to claim 13, wherein the thin film transistor includes a gate electrode formed under the polycrystalline thin film.

15. The method according to claim 13, wherein the thin film transistor includes a gate electrode formed above the polycrystalline thin film.

16. The method according to claim 13, wherein the flat panel display device comprises an organic electroluminescence display device or a liquid crystal display device.

17. The method according to claim 13, wherein a distance x between the center of the lowermost transmission region of a first set and the center of an uppermost transmission region of a next adjacent set satisfies expression 1 or expression 2:

$$x=(a+b)+((a+b)/m),\qquad\text{[Expression 1]}$$

$$x=(a+b)-((a+b)/m)\text{ in case that }(a+b)/m<b,\qquad\text{[Expression 2]}$$

where a is the transmission region opening size in the direction of mask movement, b is the transmission region spacing in the direction of mask movement, m is a natural number of 2 or more corresponding to the number of effective transmission region sets on the mask.

18. The method according to claim 17, wherein each transmission region has a polygonal pattern shape.

19. The method according to claim 17, wherein the width in the direction of mask movement by which the area corresponding to the transmission regions of a first transmission region set while the mask is at a first position is overlapped by the positions of the transmission regions of an adjacent transmission region set after the mask has been moved is less than a/2.

20. The method according to claim 13, wherein when n is 3 or more, and a distance x between the center of the lowermost transmission region of a first set and the center of an uppermost transmission region of a next adjacent set satisfies expression 3:

$$x=(a+b)+(a-I)\text{ and }a/2<I<a,\qquad\text{[Expression 3]}$$

where a is the transmission region opening size in the direction of mask movement, b is the transmission region spacing in the direction of mask movement, and I is the width in the direction of mask movement by which the area corresponding to the transmission regions of a first transmission region set while the mask is at a first position is overlapped by the positions of the transmission regions of an adjacent transmission region set after the mask has been moved.

21. The method according to claim 20, wherein I satisfies the following expression 4:

$$I=a-[(\text{grain length}-a)/(\text{the number of scans}-2)].\qquad\text{[Expression 4]}$$

22. The method according to claim 13, wherein a non-transmission region in a first non-transmission region set is spaced apart in a direction perpendicular to the direction of mask movement from a non-transmission region in a next adjacent non-transmission region set in the direction of mask movement.

23. The method according to claim 13, wherein the non-transmission regions have a dot shape.

24. A method of forming a polycrystalline thin film comprising:
crystallizing a first area by applying a laser beam to the first area through a mask having a mixed structure of transmission region sets each comprising one or more transmission regions through which the laser beam is capable of passing and one or more regions which are opaque to the laser beam, wherein the first area aligns with a first transmission region of a first transmission region set;
moving the mask such that a second transmission region of a second transmission set aligns with a second area, wherein the second area overlaps the first area in the direction of mask movement; and
moving the mask a distance t such that the first transmission region aligns with a third area, wherein the third area overlaps the first area in the direction of mask movement by a-t, wherein a is the transmission region opening size in the direction of mask movement, and t is less than a.

25. A method of forming a polycrystalline thin film comprising:
crystallizing a first area by applying a laser beam to the first area through a mask having a mixed structure of transmission region sets each comprising one or more transmission regions through which the laser beam is capable of passing and one or more regions which are opaque to the laser beam, wherein the first area aligns with a first transmission region of a first transmission region set; and
moving the mask such that a second transmission region of a second transmission set aligns with a second area, wherein the second area overlaps the first area in the direction of mask movement,
wherein a distance x in the direction of mask movement between the center of the lowermost transmission region of the first set and the center of an uppermost transmission region of the second set satisfies expression 1 or expression 2:

$$x=(a+b)+((a+b)/m),\qquad\text{[Expression 1]}$$

$$x=(a+b)-((a+b)/m)\text{ where }(a+b)/m<b,\qquad\text{[Expression 2]}$$

wherein a is the transmission region opening size in the direction of mask movement, b is the transmission region spacing in the direction of mask movement, m is a natural number of 2 or more and is the number of effective transmission region sets on the mask.

26. A method of forming a polycrystalline thin film comprising:

crystallizing a first area by applying a laser beam to the first area through a mask having a mixed structure of transmission region sets each comprising one or more transmission regions through which the laser beam is capable of passing and one or more regions which are opaque to the laser beam, wherein the first area aligns with a first transmission region of a first transmission region set; and moving the mask such that a second transmission region of a second transmission set aligns with a second area, wherein the second area overlaps the first area in the direction of mask movement, wherein a distance x between the center of the lowermost transmission region of the first set and the center of an uppermost transmission region of the second set satisfies expression 3:

$$x=(a+b)+(a-I) \text{ and } a/2<I<a, \quad \text{[Expression 3]}$$

where a is the transmission region opening size in the direction of mask movement, b is the transmission region spacing in the direction of mask movement, and I is the width in the direction of mask movement by which the area corresponding to the transmission regions of a first transmission region set while the mask is at a first position is overlapped by the positions of the transmission regions of an adjacent transmission region set after the mask has been moved.

* * * * *